(12) United States Patent
Ieong et al.

(10) Patent No.: US 7,098,508 B2
(45) Date of Patent: Aug. 29, 2006

(54) ULTRA-THIN SILICON-ON-INSULATOR AND STRAINED-SILICON-DIRECT-ON-INSULATOR WITH HYBRID CRYSTAL ORIENTATIONS

(75) Inventors: Meikei Ieong, Wappingers Falls, NY (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/932,982

(22) Filed: Sep. 2, 2004

(65) Prior Publication Data

US 2005/0045995 A1 Mar. 3, 2005

Related U.S. Application Data

(62) Division of application No. 10/647,395, filed on Aug. 25, 2003, now Pat. No. 6,815,278.

(51) Int. Cl.
*H01L 29/72* (2006.01)

(52) U.S. Cl. .............. 257/347; 257/354; 257/401

(58) Field of Classification Search ......... 257/64, 257/66, 192, 527, 347; 438/198, 199
See application file for complete search history.

(56) References Cited

U.S. PATENT DOCUMENTS

| | | | | |
|---|---|---|---|---|
| 4,933,298 A | * | 6/1990 | Hasegawa | ............ 438/150 |
| 6,603,156 B1 | * | 8/2003 | Rim | ............ 257/190 |
| 6,858,488 B1 | * | 2/2005 | Dokumaci et al. | ...... 438/231 |
| 6,902,962 B1 | * | 6/2005 | Yeo et al. | .............. 438/150 |
| 6,903,384 B1 | * | 6/2005 | Hsu et al. | ............ 257/192 |
| 6,911,379 B1 | * | 6/2005 | Yeo et al. | .............. 438/480 |
| 2004/0150042 A1 | * | 8/2004 | Yeo et al. | ............ 257/347 |

* cited by examiner

*Primary Examiner*—Edward Wojciechowicz
(74) *Attorney, Agent, or Firm*—Scully, Scott, Murphy & Presser, P.C.; Wan Yee Cheung, Esq.

(57) ABSTRACT

The invention provides integrated semiconductor devices that are formed upon an SOI substrate having different crystal orientations that provide optimal performance for a specific device. Specifically, an integrated semiconductor structure including at least an SOI substrate having a top semiconductor layer of a first crystallographic orientation and a semiconductor material of a second crystallographic orientation, wherein the semiconductor material is substantially coplanar and of substantially the same thickness as that of the top semiconductor layer and the first crystallographic orientation is different from the second crystallographic orientation is provided. The SOI substrate is formed by forming an opening into a structure that includes at least a first semiconductor layer and a second semiconductor layer that have different crystal orientations. The opening extends to the first semiconductor layer. A semiconductor material is epitaxial grown in the opening and then various etching and etch back processing steps are used in forming the SOI substrate.

7 Claims, 11 Drawing Sheets

ULTRA-THIN SILICON-ON-INSULATOR AND STRAINED-SILICON-DIRECT-ON-INSULATOR WITH HYBRID CRYSTAL ORIENTATIONS

RELATED APPLICATION

This application is a divisional of U.S. application Ser. No. 10/647,395, filed Aug. 25, 2003 now U.S. Pat. No. 6,815,278.

This application is related to co-pending and co-assigned U.S. patent application Ser. No. 10/250,241, filed Jun. 23, 2003, the entire content of which is incorporated herein by reference.

FIELD OF THE INVENTION

The present invention relates to high-performance metal oxide semiconductor field effect transistors (MOSFETs) for digital or analog applications, and more particularly to MOSFETs utilizing carrier mobility enhancement from substrate surface orientation.

BACKGROUND OF THE INVENTION

In present semiconductor technology, complementary metal oxide semiconductor (CMOS) devices, such as nFETs (i.e., n-channel MOSFETs) or pFETs (i.e., p-channel MOSFETs), are typically fabricated upon semiconductor wafers, such as Si, that have a single crystal orientation. In particular, most of today's semiconductor devices are built upon Si having a (100) crystal orientation.

Electrons are known to have a high mobility for a (100) Si surface orientation, but holes are known to have high mobility for a (110) surface orientation. That is, hole mobility values on (100) Si are roughly 2×–4× lower than the corresponding electron hole mobility for this crystallographic orientation. To compensate for this discrepancy, pFETs are typically designed with larger widths in order to balance pull-up currents against the nFET pull-down currents and achieve uniform circuit switching. pFETs having larger widths are undesirable since they take up a significant amount of chip area. On the other hand, hole mobilities on (110) Si are 2× higher than on (100) Si; therefore, pFETs formed on a (110) surface will exhibit significantly higher drive currents than pFETs formed on a (100) surface. Unfortunately, electron mobilities on (110) Si surfaces are significantly degraded compared to (100) Si surfaces.

As can be deduced from the above, the (110) Si surface is optimal for pFET devices because of excellent hole mobility, yet such a crystal orientation is completely inappropriate for NFET devices. Instead, the (100) Si surface is optimal for nFET devices since that crystal orientation favors electron mobility.

In view of the above, there is a need for providing integrated semiconductor devices that are formed upon a substrate having different crystal orientations that provide optimal performance for a specific device. A need also exists to provide a method to form such an integrated semiconductor device in which both the nFETs and the pFETs are formed on a silicon-on-insulator substrate having different crystallographic orientations in which the semiconducting layers that the devices are built upon are substantially coplanar and have substantially the same thickness.

SUMMARY OF THE INVENTION

One object of the present invention is to provide a method of fabricating integrated semiconductor devices such that different types of CMOS devices are formed upon a specific crystal orientation of a silicon-on-insulator (SOI) substrate that enhances the performance of each device.

Another object of the present invention is to provide a method of fabricating integrated semiconductor devices such that the pFETs are located on a (110) crystallographic plane, while the nFETs are located on a (100) crystallographic plane of the same SOI substrate.

A further object of the present invention is to provide a method of integrating SOI technology with CMOS technology using simple and easy processing steps.

A still further object of the present invention is to provide a method of fabricating an integrated semiconductor structure in which both CMOS devices, i.e., pFETs and nFETs, are SOI like.

A yet further object of the present invention is to provide a method of fabricating an integrated semiconductor structure comprising an SOI substrate having different crystal orientations in which the semiconducting layers that the devices are built upon are substantially coplanar and have substantially the same thickness.

The inventive method, which achieves the above-mentioned objects, begins with first providing a structure that includes a carrier wafer and a film stack comprising at least a first semiconductor layer of a first crystal orientation and an overlying second semiconductor layer of a second crystal orientation which differs from the first crystal orientation. This providing step includes forming a substrate that includes the first semiconductor layer and the carrier wafer and then bonding at least the second semiconductor layer to the first semiconductor layer.

An opening, i.e., trench, is then formed into the structure mentioned above which exposes a portion of the first semiconductor layer. A semiconductor material having the same crystal orientation as the first semiconductor layer is epitaxially grown in the opening on the exposed surface of the first semiconductor layer. Spacers are typically formed on the exposed sidewalls of the opening prior to forming the semiconductor material. An insulator layer is formed atop the structure and a handling wafer is bonded to the insulator layer. The resultant structure is flipped, top to bottom, and the carrier wafer is removed exposing the first semiconductor layer. The exposed first semiconductor layer is then removed and a portion of the previously grown semiconductor layer is etched back to provide a structure in which the semiconductor material having the first crystallographic orientation is substantially coplanar and of substantially the same thickness as that of the second semiconductor layer.

At least one nFET and at least one pFET may then be formed on either the second semiconductor layer or the semiconductor material depending on the surface orientation of that layer. Both CMOS devices, i.e., the nFET and the pFET, are SOI like devices since that are formed in an SOI layer, i.e., the second semiconductor layer or the regrown semiconductor material, that is separated from the handling wafer by the insulator layer.

The present invention also provides a method of fabricating a uniform strained-silicon-direct-on-insulator (SS-DOI) structure across a wafer that has different crystal orientations for nFETS and pFETS. The SSDOI structure is made using processing steps similar to those described above. In the SSDOI embodiment, graded SiGe alloy layers and strained Si layers are used.

DETAILED DESCRIPTION OF THE INVENTION

The present invention, which provides a method of forming an SOI structure with the same thickness of the top SOI layer across the entire wafer where some area contains different crystal orientations and/or materials from the rest of the area, will now be described in greater detail by referring to the drawings that accompany the present application. In the accompanying drawings, like and corresponding elements are referred to by like reference numerals.

Figure 1:
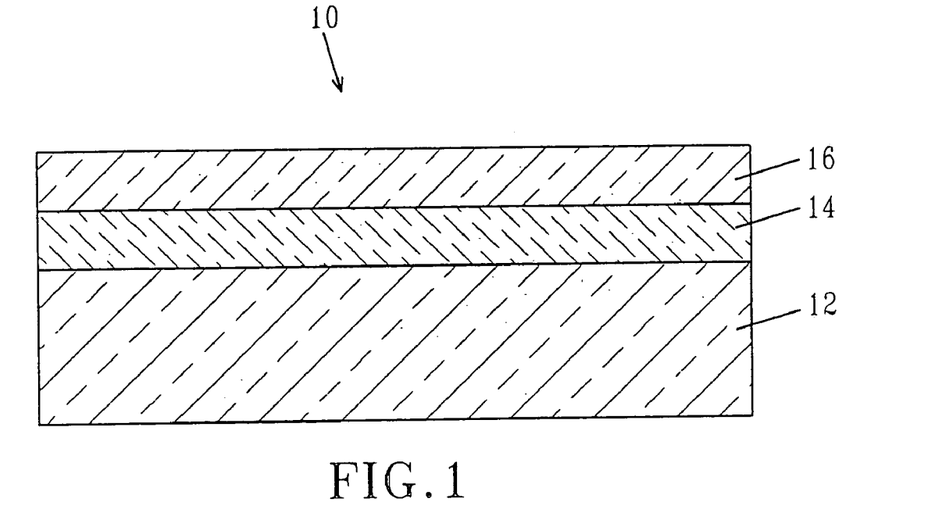
FIG. 1 is a pictorial representation (through a cross sectional view) illustrating an initial structure in which a first semiconductor layer having a first crystal orientation is formed on carrier wafer that includes an optional etch stop layer.

Referring to FIG. 1 there is shown an initial substrate 10 that is employed in the present invention. Initial substrate 10 comprises a carrier wafer 12, an optional etch stop layer 14 located on the carrier wafer 12, and a first semiconductor layer 16 of a first crystal orientation on the optional etch stop layer 14. In embodiments in which the optional etch stop layer 14 is not present, the first semiconductor layer 16 is located directly on the carrier wafer 12.

Carrier wafer 12 is comprised of any semiconductor material including, for example, Si, SiC, SiGe, SiGeC, Ge alloys, GaAs, InAs, InP as well as other III/V or II/VI compound semiconductors. The thickness and crystal orientation of the carrier wafer is inconsequential to the present invention.

Optional etch stop layer 14 may comprise an insulating material such as an oxide, nitride, oxynitride or any combination thereof, or, in some embodiments, the optional etch layer 14 may be a semiconductor material. The etch stop layer 14 is optional as long as the carrier wafer 12 can be removed selectively from the first semiconductor layer 16. The thickness of the optional etch stop layer 14 may vary depending on the material and technique used in forming the same. Typically, however, the optional etch stop layer 14 has a thickness of from about 100 to about 1000 nm. The optional etch stop layer 14 may be formed by a deposition process, including for example, chemical vapor deposition (CVD), plasma-enhanced chemical vapor deposition (PECVD), physical vapor deposition (PVP), or an epitaxial growth method, or by ion implantation and annealing.

The first semiconductor layer 16 is comprised of any semiconductor material including, for example, Si, SiC, SiGe, SiGeC, Ge alloys, GaAs, InAs, InP as well as other III/V or II/VI compound semiconductors. In embodiments in which the optional etch stop layer 14 is formed by ion implantation and annealing, the first semiconductor layer 16 is an SOI layer of a silicon-on-insulator structure. The first semiconductor layer 16 has a first crystallographic orientation, which is preferably (100). Although a (100) crystal orientation is preferred, the first semiconductor layer 16 may have a (111), or a (110) crystallographic orientation.

The thickness of the first semiconductor layer 16 may vary depending on the technique used in fabricating the same. Typically, however, the first semiconductor layer 16 has a thickness of from about 5 to about 500 nm, with a thickness of from about 5 to about 100 nm being more highly preferred.

The initial substrate 10 shown in FIG. 1 is made using conventional processes well known to those skilled in the art. For example, the initial substrate 10 can be formed using various deposition techniques wherein layers 14 and 16 are grown or deposited on a surface of the carrier wafer 12. Alternatively, the initial substrate 10 can be formed using a separation by ion implantation of oxygen (SIMOX) process or wafer bonding and thinning by using a smart cut or other related thinning process. When SIMOX is employed, oxygen ions are first implanted into a carrier wafer and then a buried oxide region is formed by annealing. In the case of wafer bonding, the carrier wafer 12 can be any material that can be bonded with the first semiconductor layer 16 and thereafter go through a subsequent high temperature process.

Figure 2:
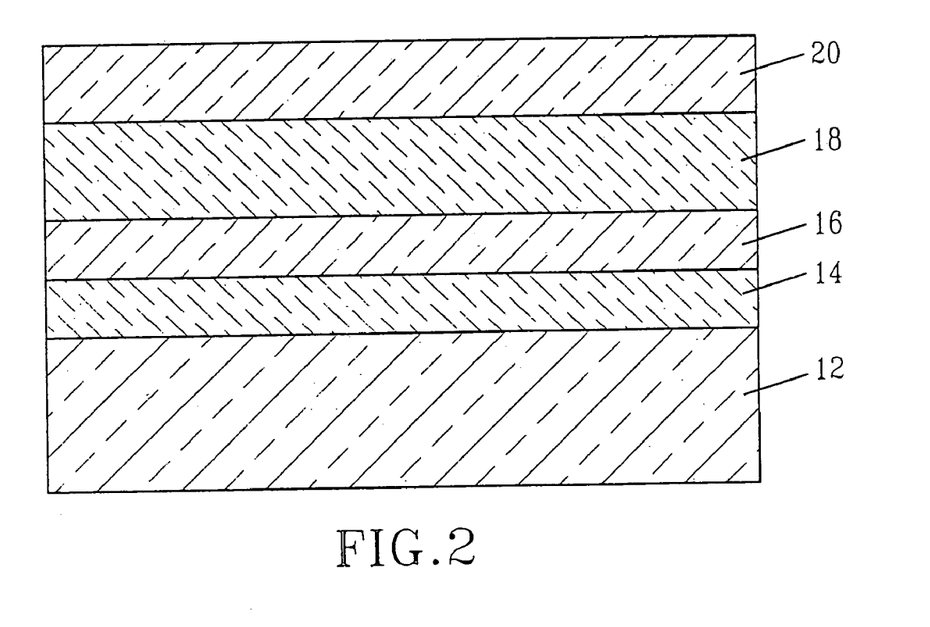
FIG. 2 is a pictorial representation (through a cross sectional view) illustrating a second semiconductor layer having a second crystal orientation that differs from the first crystal orientation formed on the substrate of FIG. 1 by wafer bonding.

Next, a second semiconductor layer 20 having a second crystallographic orientation that differs from the first crystallographic orientation of the first semiconductor layer 16 is applied to the structure shown in FIG. 1. The second semiconductor layer 20 may be formed directly atop the first semiconductor layer 16, or as is shown in FIG. 2, an insulator 18 may be formed between the first semiconductor layer 16 and the second semiconductor layer 20. The insulator 18 is optional if the two semiconductor layers, i.e., layers 16 and 20, can be directly bonded on top of each other and removed selectively from one another in a subsequent step.

The structure with, or without, the optional insulator 18, is formed utilizing a thermal bonding process followed by an optional thinning process. The bonding is achieved by first bringing two wafers into intimate contact with other; optionally applying an external force to the contacted wafers; and then heating the two contacted wafers under conditions that are capable of bonding the two wafers together. The two wafers used in fabricating the bonded structure shown in FIG. 2 may include two SOI wafers, wherein one of the wafers includes the second semiconductor layer 20 and the other wafer, see FIG. 1, includes the first semiconductor layer 16; an SOI wafer and a bulk semiconductor wafer; two bulk semiconductor wafers in which at least one of the wafers contains the insulating layer 18 thereon; or an SOI wafer and a bulk wafer which includes an ion implant region, such as a $H_2$ implant region, which can be used to split a portion of at least one of the wafers during bonding. The present invention also contemplates the use of two bulk wafers where one of the wafers has $H_2$ implanted therein.

The heating step of the bonding process may be performed in the presence or absence of an external force. The heating step is typically performed in an inert ambient at a temperature of from about 600° to about 1300° C. for a time period of from about 2 to about 20 hours. More preferably, the bonding is performed at a temperature of from about 900° to about 1200° C. for a time period of from about 2 to about 20 hours. The term "inert ambient" is used in the present invention to denote an atmosphere in which an inert gas, such as He, Ar, $N_2$, Xe, Kr or a mixture thereof, is employed. A preferred ambient used during the bonding process is $N_2$. In embodiments in which hydrogen implantation is used, an initial heating step that is performed at a temperature of from about 200° to about 500° C. may be employed prior to the previously mentioned heating step.

In the embodiment where two SOI wafers are employed, some material layers of at least one of the SOI wafers may be removed after bonding utilizing a planarization process such as chemical mechanical polishing (CMP) or grinding and etching.

In the embodiment in which one of the wafers includes an ion implant region, the ion implant region forms a porous region during bonding which causes a portion of the wafer above the ion implant region to break off leaving a bonded wafer such as is shown, for example, in FIG. 2. The implant region is typically comprised of hydrogen ions that are implanted into the surface of the wafer utilizing ion implantation conditions that are well known to those skilled in the art.

The optional insulator 18, if present, may have a variable thickness, but typically, the optional insulator 18 has a thickness of from about 100 to about 1000 nm. Insofar as the second semiconductor layer 20 is concerned, the thickness of that layer may also vary depending upon its origin. Typically, however, the second semiconductor layer 20 has a thickness of from about 10 to about 500 nm, with a thickness of from about 20 to about 100 nm being more highly preferred. As stated above, the second semiconductor layer 20 has a second crystallographic orientation that is different from the crystallographic orientation of the first semiconductor layer 16. The second semiconductor layer 20 thus preferably has a (110) crystal orientation. Although a (110) crystal orientation is preferred, the second semiconductor layer 20 may have a (111), or a (100) crystallographic orientation depending on the crystallographic orientation of the first semiconductor layer 16.

Figure 3:
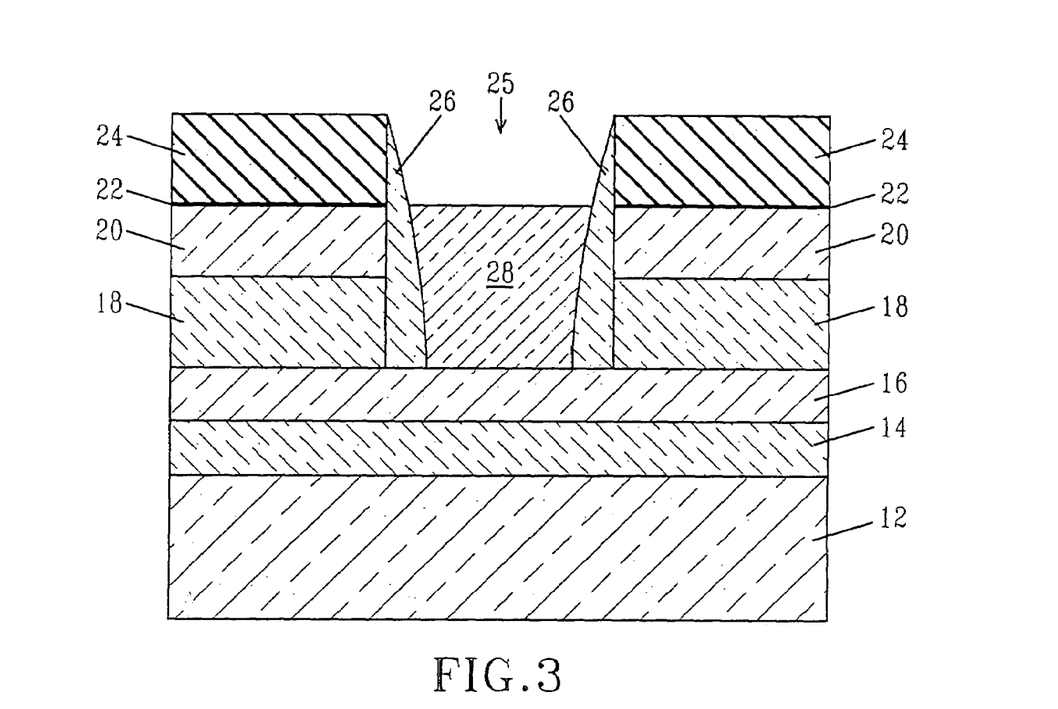
FIG. 3 is a pictorial representation (through a cross sectional view) illustrating a semiconductor material that is selectively grown from the first semiconductor layer though an opening where the second semiconductor layer and the sidewalls of the opening are covered by masking materials.

After providing the bonded structure shown in FIG. 2, semiconductor material layer 28 is formed selectively on an exposed bottom surface of the first semiconductor layer 16 through an opening 25. The structure including the semiconductor material layer 28 is shown in FIG. 3. In addition to the semiconductor material layer 28, the structure shown in FIG. 3 also includes an optional pad layer 22, patterned masking layer 24, and spacers 26.

The structure shown in FIG. 3 is formed by optionally forming pad layer 22 on an upper surface of the second semiconductor layer 20 by a thermal process, such as oxidation, or by a conventional deposition process such as chemical vapor deposition (CVD), plasma-enhanced CVD, atomic layer deposition, chemical solution deposition as well as other like deposition processes. The optional pad layer 22 is comprised of an insulating material including, oxides, nitrides, oxynitrides or any combination thereof. The optional pad layer 22 may have a variable thickness depending on the technique used in forming the same. The optional pad layer 22 serves as an etch layer during the later removal of the patterned masking layer 24.

A patterned masking layer 24 is then formed on a predetermined portion of the bonded structure so as to protect a portion (or portions) of the structure, while leaving at least one other portion of the bonded structure unprotected. The protected portions of the bonded structure define a first device region of the structure, whereas the unprotected portions of the bonded structure define a second device area. The patterned masking layer 24 is a nitride or oxynitride layer that is formed and patterned utilizing lithography and etching.

After providing the patterned masking layer 24 to the bonded structure, with, or without the optional pad layer 22, the structure is subjected to one or more etching steps so as to provide at least one opening (or trench) 25 that exposes a surface of the first semiconductor layer 16. Specifically, the one or more etching steps used at this point of the present invention remove the unprotected portions of the optional pad layer 22, as well as underlying portions of the second semiconductor layer 20, and, if present, a portion of the insulator 18.

The etching may be performed utilizing a single etching process or multiple etching steps may be employed. The etching used at this point of the present invention may include a dry etching process such as reactive-ion etching, ion beam etching, plasma etching or laser etching, a wet etching process wherein a chemical etchant is employed or any combination thereof. The etching may stop on the upper surface of the first semiconductor layer 16 or it may stop at a region slightly below the upper surface of the first semiconductor layer 16. In a preferred embodiment of the present invention, reactive-ion etching (RIE) is used in selectively removing the unprotected portions of the optional pad layer 22, the second semiconductor layer 20 and, if present, the optional insulator 18.

The opening 25 has exposed sidewalls after etching which include the remaining optional pad layer 22, the remaining second semiconductor layer 20, the remaining optional insulator 18 as well as the remaining first semiconductor layer 16. The exposed sidewalls of layers 22, 20 and 18 are aligned with an outer most edge of patterned masking layer 24.

With patterned masking layer 24 in place, a spacer 26 is formed on each of the exposed sidewalls in the at least one opening 25. The spacer 26, which is formed by deposition and etching, is comprised of an insulating material such as, for example, an oxide. The spacer 26 is used in the present invention as a selective epitaxy block mask to block epitaxy from the second semiconductor layer 20 exposed on the etched sidewall to ensure high-quality single grain crystals in the etched area after epitaxy.

After forming the spacer 26, a semiconductor material 28 is formed selectively on the exposed surface of the first semiconductor layer 16 providing the structure shown, for example, in FIG. 3. In accordance with the present invention, the semiconductor material 28 has a crystallographic orientation that is the same as the crystallographic orientation of the first semiconductor layer 16.

The semiconductor material 28 may comprise any Si-containing semiconductor, such as Si, strained Si, SiGe, SiC, SiGeC or combinations thereof, which is capable of being formed utilizing a selective epitaxial growth method. In some preferred embodiments, semiconductor material 28 is comprised of Si. In the present invention, semiconductor material 28 may be referred to as a regrown semiconductor material. The semiconductor material 28 formed by the epitaxy process may be grown higher than the upper surface of the patterned masking layer 24 and then polished back to the upper surface of the patterned masking layer 24 to remove any possible facet growth. An upper surface of the semiconductor material 28 can be recessed so as to be substantially level with an upper surface of the second semiconductor layer 20. This recess may be achieved by utilizing a reactive ion etch process. Note that the semiconductor material 28 may be a different material from the first semiconductor layer 16. Thus, for example, a SiGe alloy may be grown on a Si layer.

Figure 4:
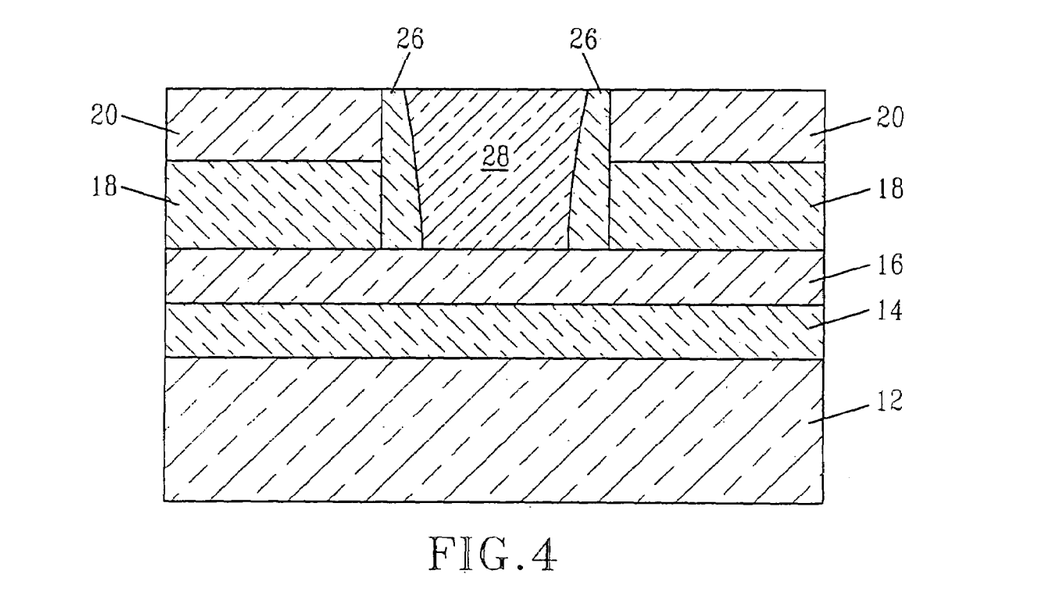
FIG. 4 is a pictorial representation (through a cross sectional view) illustrating a structure of FIG. 3 after the surface is planarized and the masking layer used during the semiconductor material growth is removed.

After providing the structure shown, for example, in FIG. 3, the patterned masking layer 24 as well as the optional pad layer 22 are removed from the structure to provide the structure shown, for example, in FIG. 4. Note that the spacer 26 on each of the trench sidewalls can be recessed somewhat below the surfaces of semiconductor layers 28 and 20. The removal of the patterned masking layer 24 is performed utilizing an etching process or by a chemical mechanical polishing (CMP) process. If present, the optional pad layer 22 is removed thereafter using an etching process that selectively removes the pad layer 22 as compared with semiconductor material.

Figure 5:
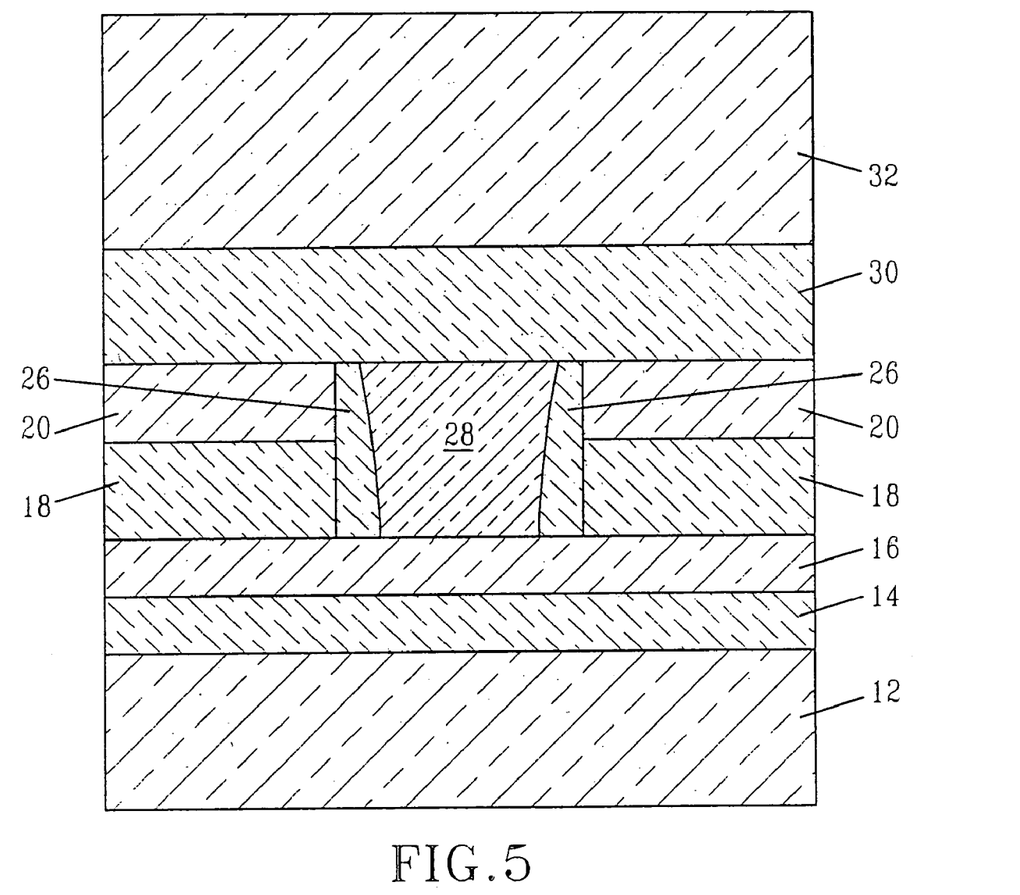
FIG. 5 is a pictorial representation (through a cross sectional view) illustrating a structure that is formed after an insulator layer is deposited and a handling wafer is bonded thereto.

An insulator layer 30 is formed over the structure shown in FIG. 4 and thereafter that resultant structure is bonded to a handling wafer 32 so as to provide the structure shown, for example, in FIG. 5. Insulator layer 30 can comprise an oxide, nitride, oxynitride or any combination thereof. Preferably, the insulator layer 30 is an oxide such as, for example, $SiO_2$. The insulator layer 30 may be formed by deposition or, alternatively, a thermal growing process may be employed. The thickness of the insulator layer 30 may vary, but typically the insulator layer 30 has a thickness of from about 100 to about 500 nm. In some instances, it may be necessary to polish the insulator layer 30 after its formation to ensure a flat surface for wafer bonding.

Handling wafer 32 may comprise the same or different semiconductor material as the carrier wafer 12. Bonding is achieved using the aforementioned bonding process. The thickness of the handling wafer 32 is inconsequential to the present invention.

Figure 6:
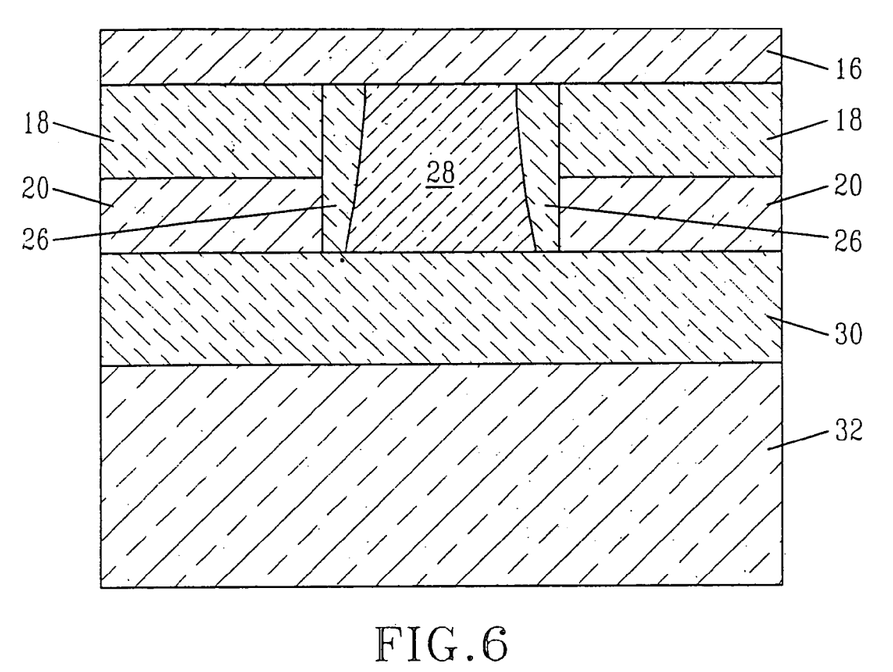
FIG. 6 is a pictorial representation (through a cross sectional view) illustrating a structure after wafer flipping, and after the wafer carrier and the optional etch stop layer have been removed.

Next, the bonded structure shown in FIG. 5 is flipped, top to bottom, such that the carrier wafer 12 is on top and the handling wafer 32 is on bottom. The carrier wafer 12 and, if present, the optional etch stop layer 14 are removed providing the structure shown, for example, in FIG. 6. In FIG. 6, a surface of first semiconductor layer 16 is exposed after flipping and removal of the carrier wafer 12 and the optional etch stop layer 14. The removal is achieved utilizing one or more etching steps, planarization or a combination thereof.

Figure 7:
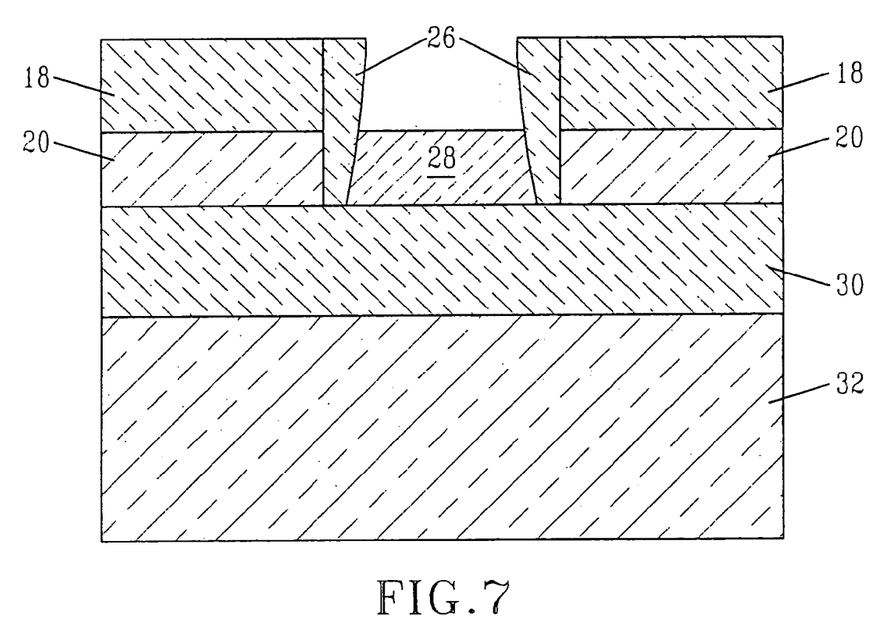
FIG. 7 is a pictorial representation (through a cross sectional view) illustrating a structure after the first semiconductor layer of the original structure has been removed and after the semiconductor material has been etched back to level out with the second semiconductor layer.

Referring now to FIG. 7, there is shown the structure that is formed after the first semiconductor layer 16 is removed from the structure illustrated in FIG. 6. The first semiconductor layer 16 is removed utilizing an etching process such as reactive-ion etching, ion beam etching, or plasma etching. The regrown semiconductor material 28 is now etched back by a reactive-ion etching process so as to be level with the upper surface of second semiconductor layer 20.

Next, and if present, the optional insulator 18 is removed and the spacers 26 are recessed below the surfaces of semiconductor materials 20 and 28 to provide the structure shown, for example, in FIG. 8. The removal of the optional insulator 18 and the recessing of the spacers 26 are achieved utilizing the same or different etching process.

Figure 8:
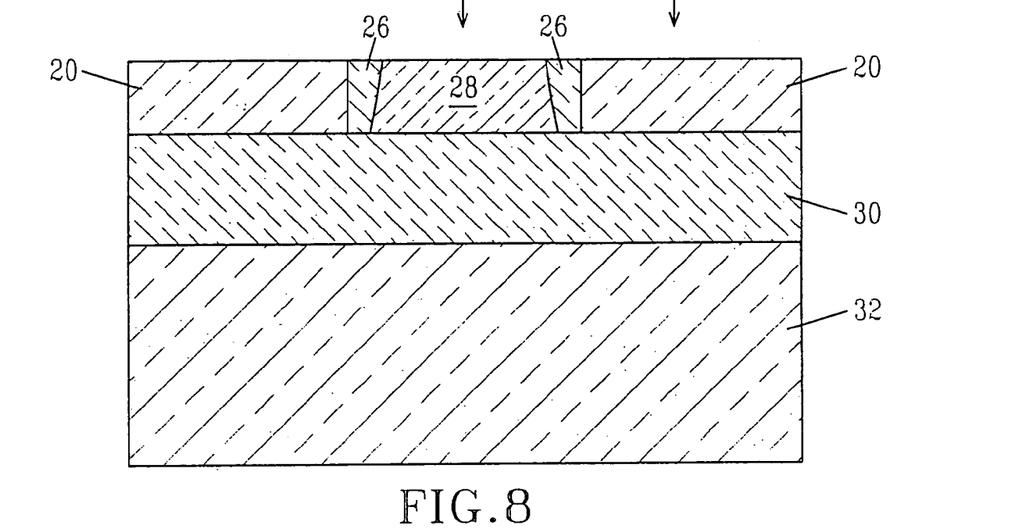
FIG. 8 is a pictorial representation (through a cross sectional view) illustrating a structure after the surface has been planarized by removing the optional insulator layer and after the spacers have been etched back.

Note that in FIG. 8, first device regions labeled as 100 and a second device region labeled as 102 are shown. The first device regions include the second semiconductor layer 20, while the second device region 102 includes the regrown semiconductor material 28. Both active areas are SOI areas since an insulating layer 30 separates the active areas from the handling wafer 32. As illustrated, the structure of FIG. 8 contains the regrown semiconductor material 28 which is substantially coplanar and of substantially the same thickness as that of the second semiconductor layer 18. The regrown semiconductor material 28 has a different crystal orientation as compared with that of the second semiconductor layer 20.

After providing the substantially planar surfaces, an isolation region 34, such as a shallow trench isolation region, is typically formed so as to isolate the first semiconductor device regions 100 from the second semiconductor device region 102. The isolation regions 34 replace the spacers 26. In some embodiments of the present invention, spacers 26 are used as the isolation region 34. The isolation region 34 is formed in the region in which the spacers are present utilizing processing steps that are well-known to those skilled in the art including, for example, trench definition and etching; optionally lining the trench with a diffusion barrier; and filling the trench with a trench dielectric such as an oxide. After the trench fill, the structure may be planarized and an optional densification process step may be performed to density the trench dielectric.

Figure 9:
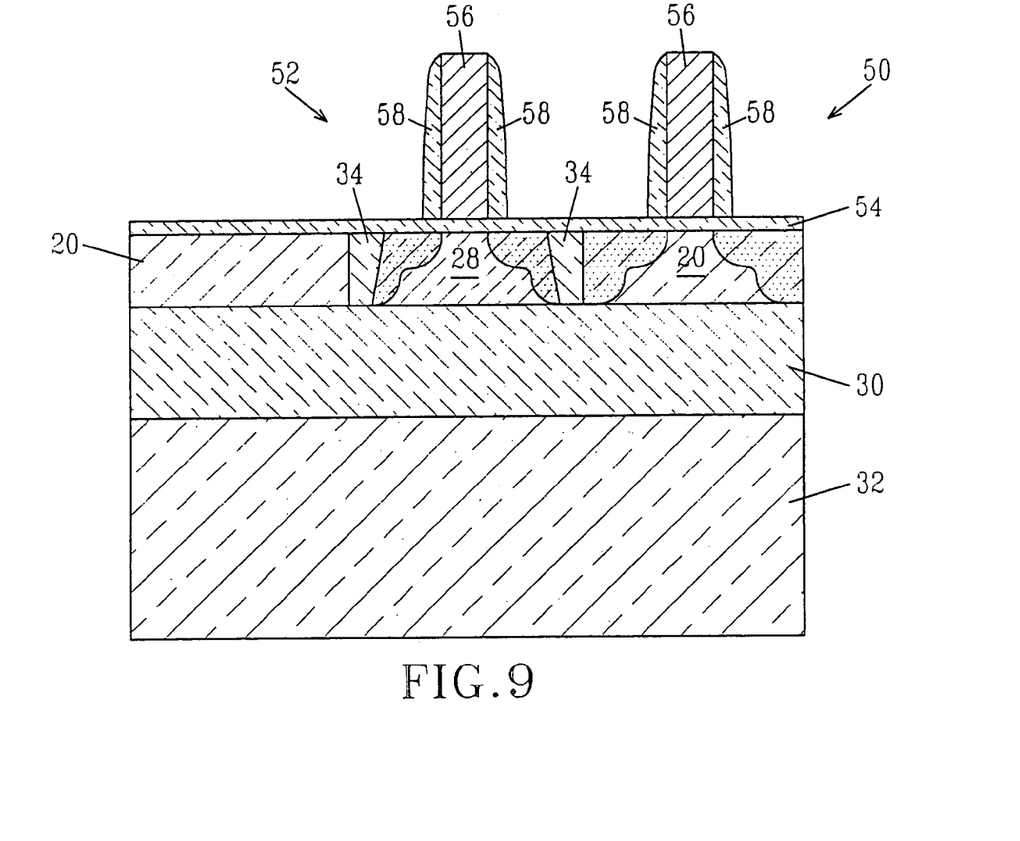
FIG. 9 is a pictorial representation (through a cross sectional view) illustrating a final structure of the present invention including an nFET and a pFET located on a surface with different crystal orientation, yet the same SOI thickness.

The resultant substantially planar structure containing isolation region 34 is shown, for example, in FIG. 9. This drawing also shows the integrated structure that is formed after a first semiconductor device 50 is formed on a portion of the second semiconductor layer 20 and a second semiconductor device 52 is formed on the regrown semiconductor material 28. Despite showing the presence of only one semiconductor device in each device region, the present invention contemplates forming a plurality of each type of device in the specific device region. The semiconductor devices include gate dielectric 54, gate conductor 56 and gate spacers 58. The source/drain regions are shown, but are not separately labeled. The semiconductor devices are formed utilizing CMOS processing steps that are well known to those skilled in the art. The semiconductor devices may be nFETs or pFETs, with nFETs preferably being formed atop a semiconductor layer having a (100) crystal surface, while pFETs are preferably formed atop a semiconductor layer having a (110) crystal orientation.

In addition to the embodiment described above, the present invention also contemplates an embodiment in which a strained-silicon-direct-on-insulator (SSDOI) structure with an NFET and pFET on different crystal orientations, but with the same SOI thickness across the wafer is formed. The following description illustrates how SSDOI structures are formed in the present invention.

In this embodiment of the present invention, the structure shown in FIG. 2 is first provided utilizing the processing techniques described above. In summary, the structure shown in FIG. 2 comprises carrier wafer 12, optional etch stop layer 14, first semiconductor layer 16, optional insulator layer 18 and second semiconductor layer 20.

After providing the structure shown in FIG. 2, a first graded SiGe alloy layer 60 is formed on top of the second semiconductor layer 20. The first graded SiGe alloy layer 60 is formed utilizing an epitaxial growth method. The thickness of the first graded SiGe alloy layer 60 may vary depending on the conditions used during the epitaxial growth process and the Ge concentration. Typically, however, the first graded SiGe alloy layer 60 has a thickness of from about 100 to about 2000 nm. The Ge content in the first graded SiGe alloy layer is typically from 0 to about 50 atomic %

Figure 10:
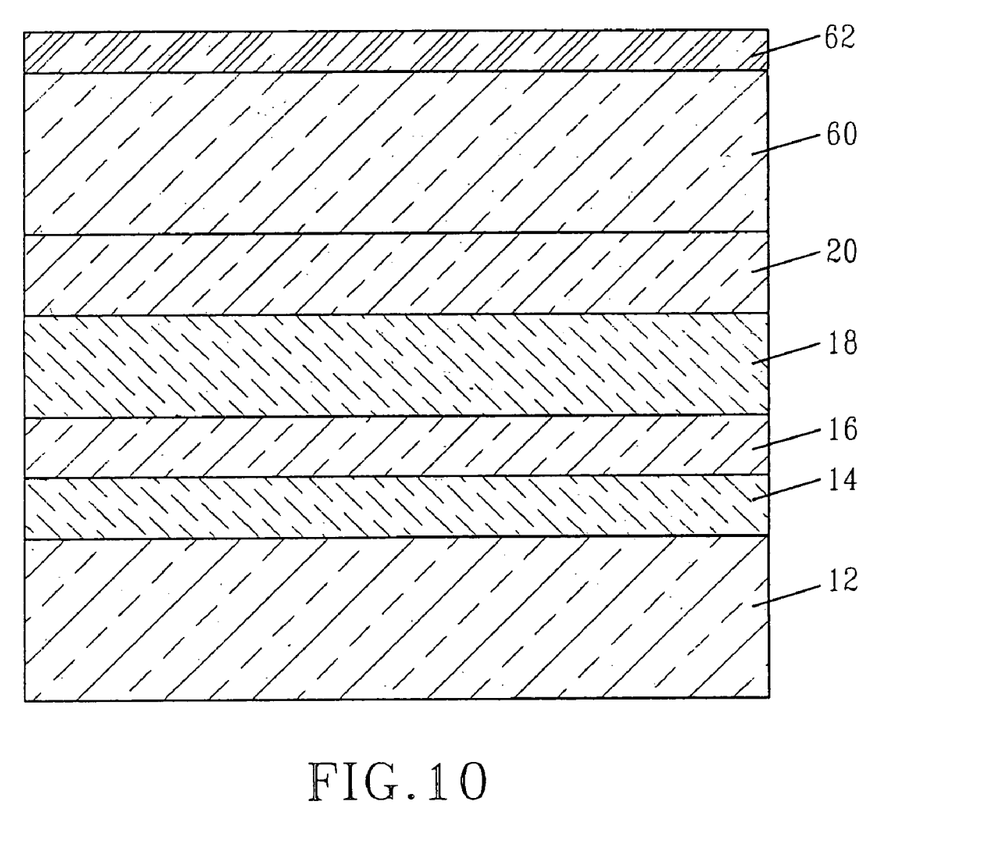
FIG. 10 is a pictorial representation (through a cross sectional view) illustrating a graded SiGe buffer layer and a strained Si layer grown on a semiconductor layer of a specific crystal orientation.

After forming the first graded SiGe alloy layer 60, a first strained Si layer 62 having a predetermined crystal orientation is formed on the graded SiGe alloy layer. The first strained Si layer 62 is a thin layer having a thickness of about 30 nm or less depending on the magnitude of the strain. Typically, higher strained Si requires thin Si layers. The first strained Si layer 62 is formed utilizing an epitaxial growth method that is capable of forming a strained Si layer. The resultant structure including first graded SiGe alloy layer 60 and first strained Si layer 62 is illustrated in FIG. 10.

Figure 11:
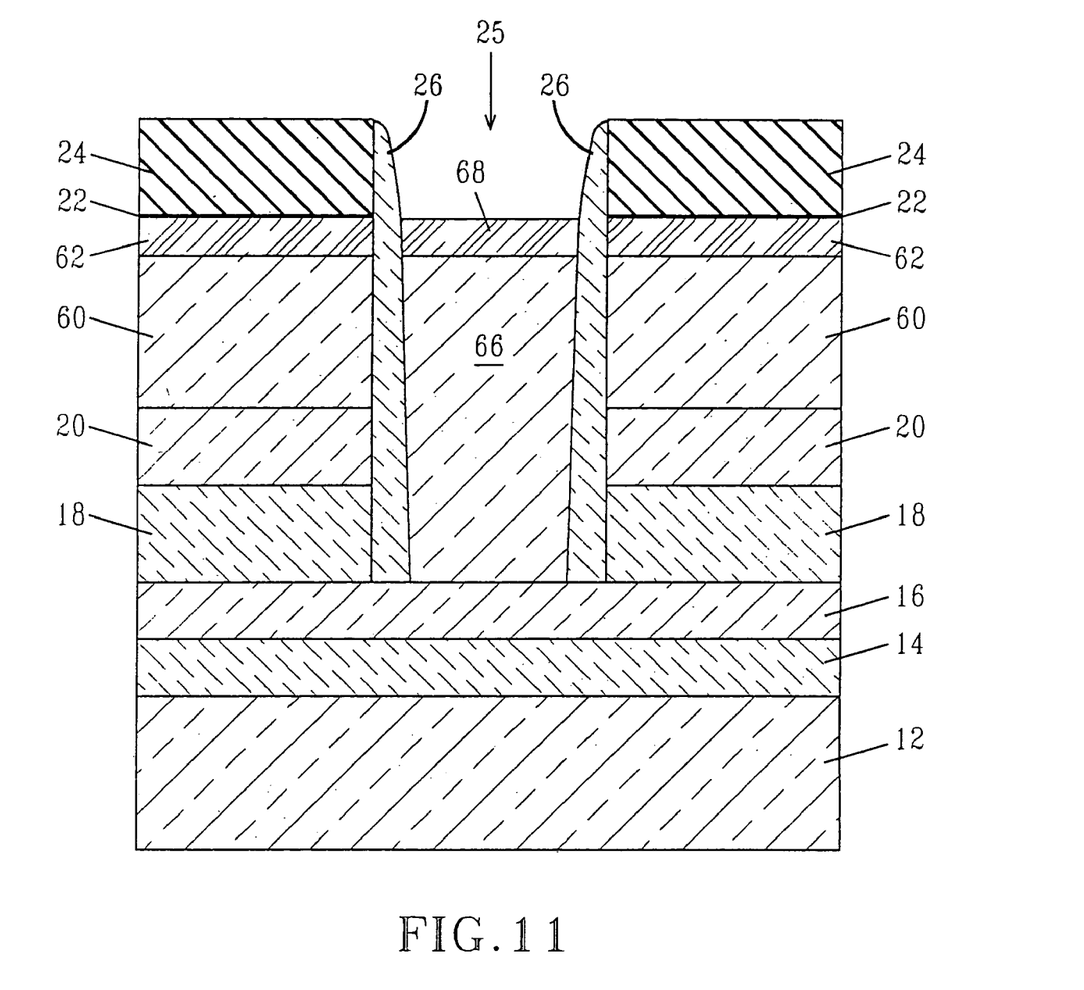
FIG. 11 is a pictorial representation (through a cross sectional view) illustrating a graded SiGe buffer layer and stained Si layer grown on a semiconductor layer of a specific crystal orientation that differs from the crystal orientation of the semiconductor layer of FIG. 10.

Next, the structure shown in FIG. 11 is provided utilizing similar processing steps used in forming the structure shown in FIG. 3. Specifically, the structure shown in FIG. 11 includes a second graded SiGe alloy layer 66 and a second strained Si layer 68 that are formed selectively on an exposed surface of the first semiconductor layer 16 through an opening 25. In addition to the second graded SiGe alloy layer 66 and the second strained Si layer 68, the structure shown in FIG. 11 also includes an optional pad layer 22, patterned masking layer 24, and spacers 26. The procedures used in forming the structure shown in FIG. 3 are used in forming the structure shown in FIG. 11 except that the semiconductor material 28 used in FIG. 3 is replaced with the second graded SiGe alloy layer 66 and the second strained Si layer 68. Note that the second strained Si layer 68 has a crystal orientation that differs from the first strained Si layer 62. The Ge content in the second graded SiGe alloy layer is typically from 0 to 50 atomic %.

The top surface of the second strained Si layer 68 is substantially coplanar with the top surface of the first strained Si layer 62. In the case to remove facets during the selective epitaxy, the second graded SiGe alloy layer 66 may be grown higher than the upper surface of the patterned masking layer 24, and then polished back to the upper surface of the patterned masking layer 24. Prior to growth of the second strained Si layer 68, the second graded SiGe alloy layer 66 may be recessed down to achieve a structure having a coplanar top surface of strained Si.

Figure 12:
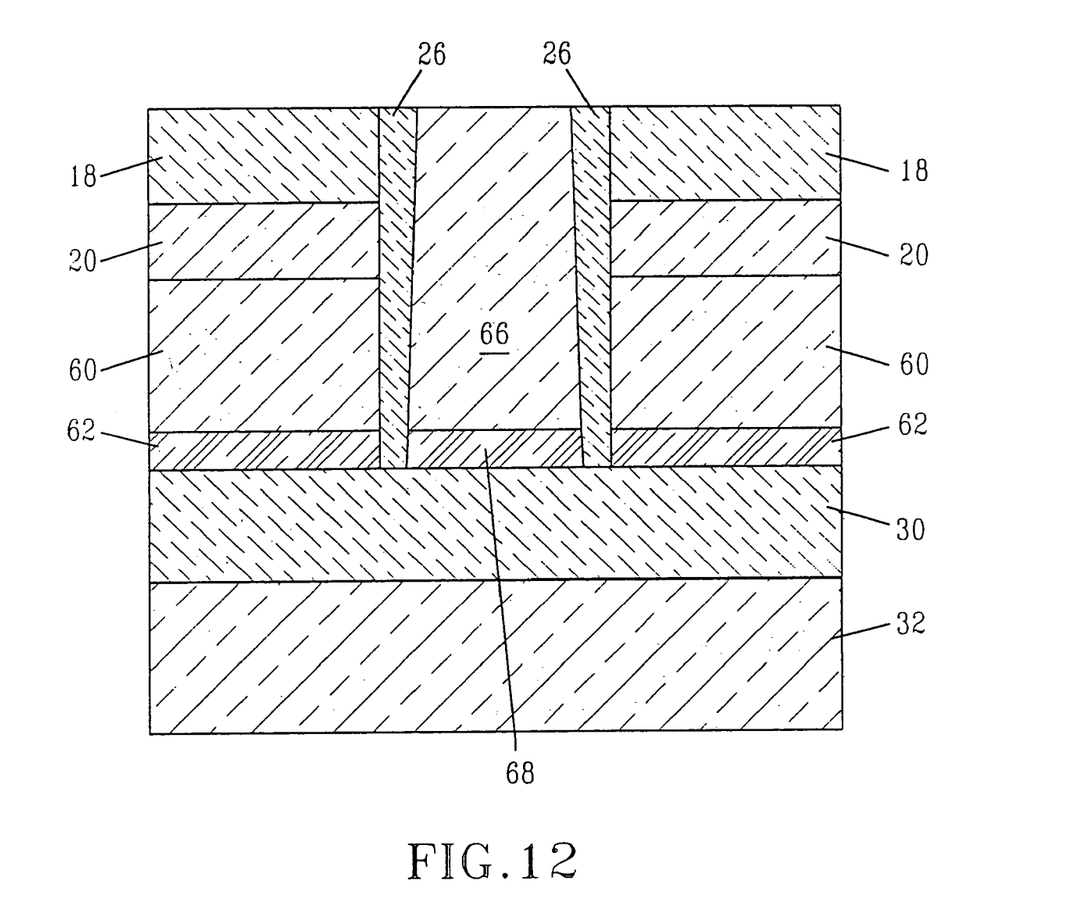
FIG. 12 is a pictorial representation (through a cross sectional view) illustrating a structure after flip bonding of the structures of FIGS. 10 and 11 with a silicon handling wafer, and removal of the original carrier wafer, optional etch stop layer and the first semiconductor layer.

FIG. 12 shows the structure that is formed after insulator layer 30 formation on the surface of the structure shown in FIG. 11, bonding the insulator layer 30 to a handling wafer 32, flipping the structure top to bottom and then removing the first semiconductor layer 16. The processing steps are the same as described above in connection with FIGS. 4–7.

Figure 13:
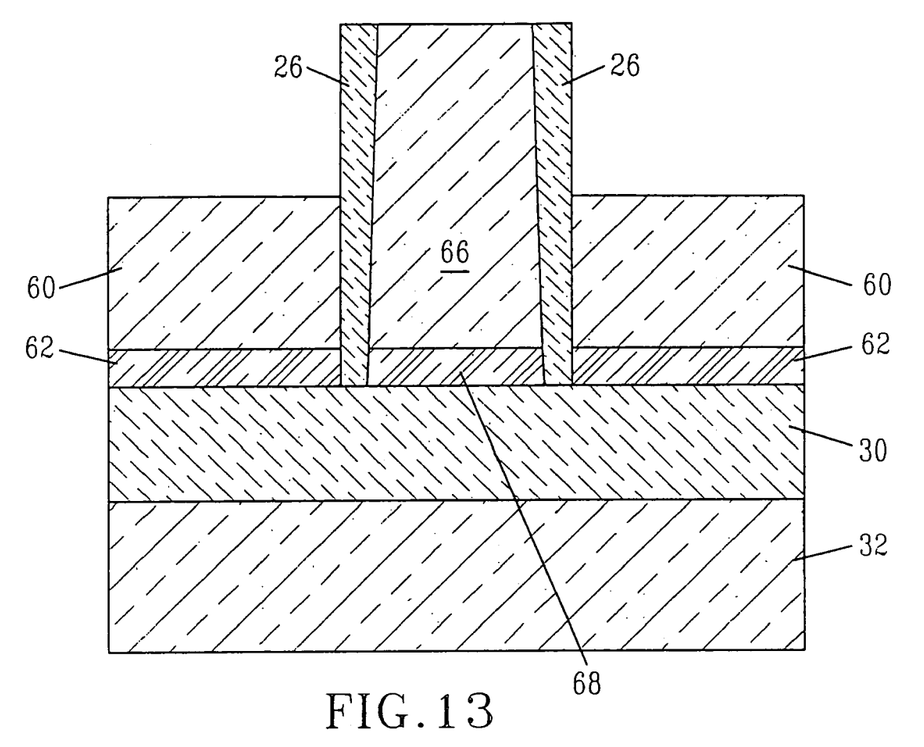
FIG. 13 is a pictorial representation (through a cross sectional view) illustrating a structure after the optional insulator layer and the second semiconductor layer are removed.

Referring now to FIG. 13 there is shown the resultant structure that is formed after optional insulator 18 and the second semiconductor layer 20 are removed from the structure. The removal of the optional insulator 18 and the second semiconductor layer 20 is performed utilizing different etching processes in which the chemical etchant used in each etching process is selective for the specific material being removed. As shown, a surface of the first graded SiGe alloy layer 60 is exposed after these removal steps.

Figure 14:
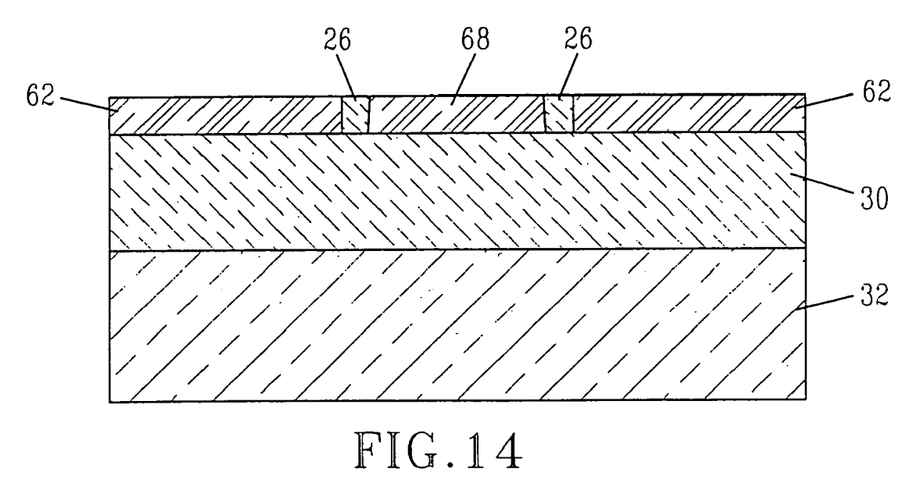
FIG. 14 is a pictorial representation (through a cross sectional view) illustrating a structure after the graded SiGe buffer layer is removed and after the spacer has been recessed.

Next, and as is shown in FIG. 14, the first and second graded SiGe alloy layers 60 and 66 are removed selective to the strained Si layers 62 and 68. The spacers 26 are recessed at this point of the present invention below the surfaces of strained Si layers 62 and 68. As shown in FIG. 14, a uniform SSDOI structure has been obtained across the wafer having different crystal orientations. Semiconductor devices such as shown in FIG. 9 can be formed atop the different crystallographic planes.

Figure 15:
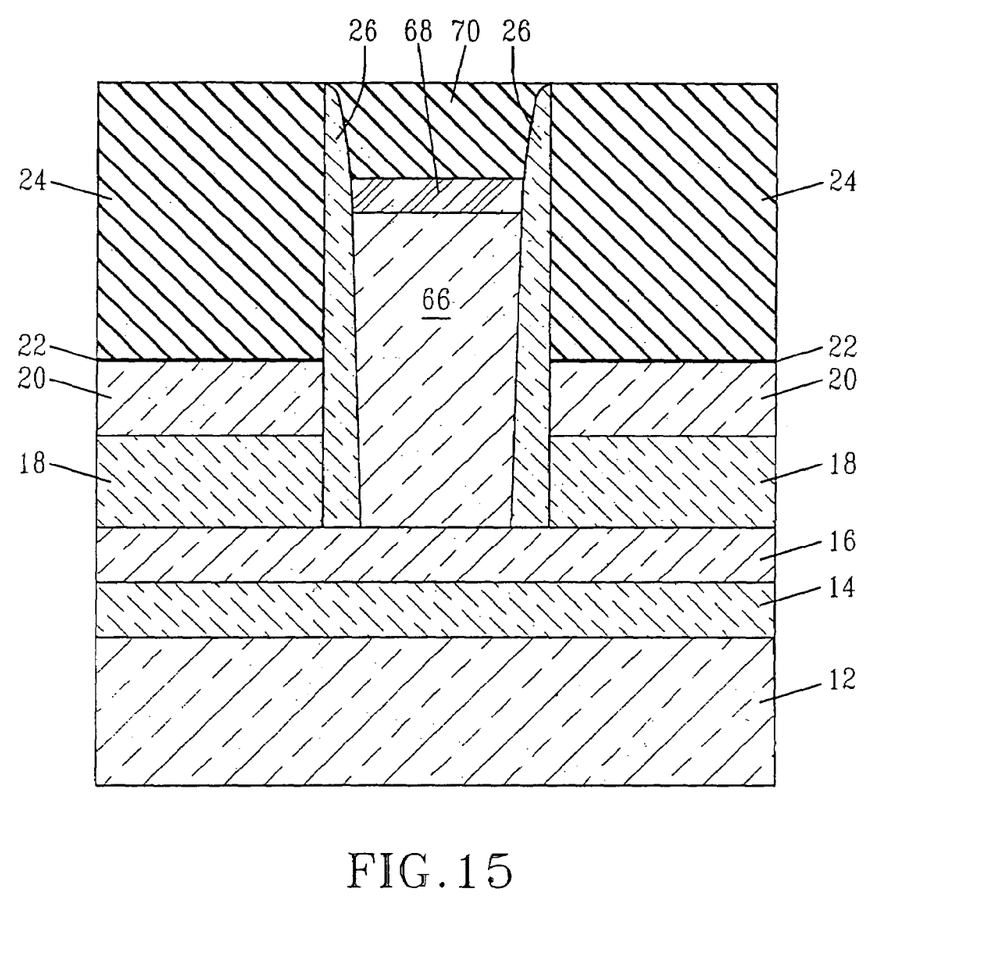
FIG. 15 is a pictorial representation (through a cross sectional view) illustrating a structure after a masking cap is formed on top of the strained silicon.

In yet another embodiment of the present invention, the first graded SiGe alloy layer 60 and the first strained Si layer 62 are formed after providing the structure shown in FIG. 3. In this embodiment, the structure shown in FIG. 3 is first provided and the layers 66 and 68 as well as masking cap 70 are formed so as to provide the structure shown, for example, in FIG. 15. Layers 66 and 68 are selectively grown atop the first semiconductor layer 16. Masking cap 70 which is typically comprised of an oxide, nitride or oxynitride is formed on the second strained Si layer 68 by deposition or a thermal process. (The masking layer 24 and the spacer 26 are used as selective epitaxy masks for the formation of the second graded SiGe alloy layer 66 and the second strained Si layer 68. The masking cap 70 and the spacer 26 are used as selective epitaxy masks for the formation of the first graded SiGe alloy layer 60 and the first strained Si layer 62.). The structure including layers 66 and 68 is shown, for example, in FIG. 16. The first graded SiGe alloy layer 60 and the first strained Si layer 62 are selectively grown on top of the second semiconductor layer 20 after removing the patterned masking layer 24 and the optional pad layer 22.

Figure 16:
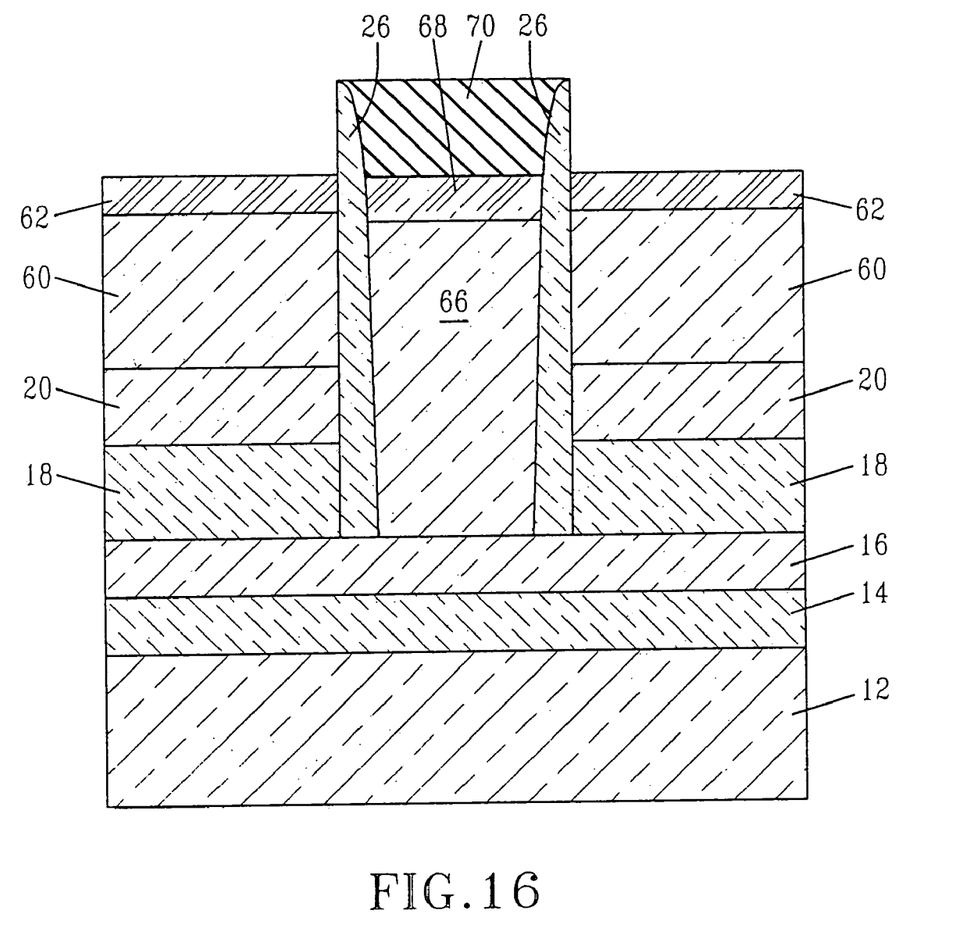
FIG. 16 is a pictorial representation (through a cross sectional view) illustrating structure after a second graded SiGe buffer layer and stained silicon layer are selectively grown on a patterned substrate.

The remaining processing steps are the same as the previously described SSDOI embodiment. The masking cap 70 can be removed either before the wafer bonding steps of it can remain in the final structure.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new is:

1. A strained-silicon-direct-on-insulator (SSDOI) comprising at least an SOI substrate comprising a first strained Si layer of a first crystallographic orientation, a second strained Si layer of a second crystallographic orientation and a spacer laterally separating said first and second strained Si layers, wherein the second strained Si layer is substantially coplanar and of substantially the same thickness as that of the first strained Si layer, said first crystallographic orientation is different from the second crystallographic orientation and said spacer has a surface below surfaces of both said first and second strained Si layers.

2. The SSDOI of claim 1 wherein the first strained Si layer has a (110) surface orientation and the second strained Si layer has a (100) surface orientation.

3. The integrated semiconductor structure of claim 2 further comprising at least one pFET located on the (110) surface orientation and at least one nFET located on the (100) surface orientation.

4. The integrated semiconductor structure of claim 1 wherein the first strained Si layer has a (100) surface orientation and the second strained Si layer has a (110) surface orientation.

5. The integrated semiconductor structure of claim 4 further comprising at least one pFET located on the (110) surface orientation and at least one nFET located on the (100) surface orientation.

6. The integrated semiconductor structure of claim 1 further comprising at least one pFET and at least one nFET, each device is located on either the first strained Si layer or the second strained Si layer, said location being dependent on the crystallographic orientation.

7. The integrated semiconductor structure of claim 6 wherein the at least one pFET is located on a (110) or a (111) crystal orientation, while the at least one nFET is located on a (100) or a (111) crystal orientation.

* * * * *

UNITED STATES PATENT AND TRADEMARK OFFICE
CERTIFICATE OF CORRECTION

| | | |
|---|---|---|
| PATENT NO. | : 7,098,508 B2 | Page 1 of 1 |
| APPLICATION NO. | : 10/932982 | |
| DATED | : August 29, 2006 | |
| INVENTOR(S) | : Meikei Ieong et al. | |

It is certified that error appears in the above-identified patent and that said Letters Patent is hereby corrected as shown below:

Column 1, Line 54:
"NFET" should read -- nFET --

Column 9, Line 23:
"NFET" should read -- nFET --

Signed and Sealed this

Twelfth Day of December, 2006

JON W. DUDAS
*Director of the United States Patent and Trademark Office*